US005643697A

United States Patent [19]

Baudry et al.

[11] Patent Number: 5,643,697

[45] Date of Patent: Jul. 1, 1997

[54] PROCESS FOR MANUFACTURING A SHADOW MASK MADE OF AN IRON/NICKEL ALLOY

[75] Inventors: Jacques Baudry, Imphy; Michel Faral, Nevers; Jean-Francois Tiers, Sauvigny les Bois, all of France

[73] Assignee: Imphy S.A., Puteaux, France

[21] Appl. No.: 577,768

[22] Filed: Dec. 22, 1995

[30] Foreign Application Priority Data

Dec. 27, 1994 [FR] France .................................. 94 15663

[51] Int. Cl.$^6$ ........................................ G03F 9/00

[52] U.S. Cl. .................................. 430/5; 430/23; 445/36

[58] Field of Search .................................. 430/23, 5, 323; 445/36

[56] References Cited

U.S. PATENT DOCUMENTS 5,308,723 5/1994 Inoue et al. .............................. 430/23

5,532,088 7/1996 Teshima et al. .......................... 430/23

FOREIGN PATENT DOCUMENTS 0561120 9/1993 European Pat. Off. .

0567989 11/1993 European Pat. Off. .

0626462 11/1994 European Pat. Off. .

0627494 12/1994 European Pat. Off. .

1309618 10/1962 France .

2668498 4/1992 France .

*Primary Examiner*—S. Rosasco

*Attorney, Agent, or Firm*—Oblon, Spivak, McClelland, Maier & Neustadt, P.C.

[57] ABSTRACT

Shadow mask and process for manufacturing a shadow mask made of an iron/nickel alloy in which: a foil perforated with holes is provided, the foil is subjected to a heat treatment in order to obtain grains whose size, as defined by the ASTM standard, is greater than or equal to ASTM 7, the foil is formed in order to give it the shape of a shadow mask.

8 Claims, No Drawings

PROCESS FOR MANUFACTURING A SHADOW MASK MADE OF AN IRON/NICKEL ALLOY

BACKGROUND OF THE INVENTION

1. Field of the Invention

The invention relates to a shadow mask and to a process for the manufacture of a shadow mask made of an iron/nickel alloy. The shadow mask of the invention is particularly suited for a color display cathode-ray tube.

2. Discussion of the Background

A color display cathode-ray tube generally comprises an envelope having a display window made of glass, including a display screen on which red, green and blue luminophores are placed. A shadow mask, perforated with a very large number of small holes, is mounted in the tube, opposite the display screen and at a short distance from it. When the tube is operating, three electron beams are generated inside the tube by three electron guns, the electron beams passing through the holes in the shadow mask and bombarding the phosphorescent areas.

The relative positions of the holes and of the luminophores are such that each electron beam bombards the phosphorescent areas corresponding to a particular color in order to form a picture. However, a significant part of the electrons is intercepted by the shadow mask and the kinetic energy of these electrons is converted into heat which raises the temperature of the shadow mask. The thermal expansion of the shadow mask, generated by this temperature rise, can cause local distortion of the shadow mask, which causes a disturbance in the placing of the holes relative to the associated luminophores. This results in errors in the colors in the picture made, and these errors are more significant the flatter the shadow mask, which is increasingly the case in current generations of cathode-ray display tubes.

It is well known that such problems, caused by thermal effects, can be avoided by manufacturing shadow masks from a material having a very low coefficient of expansion such as, for example, an iron/nickel alloy containing approximately 36% nickel. However, the high level of the mechanical properties and the difficulties in rolling such materials limit their use for this application.

It is known, from United States Patent U.S. Pat. No. 4,685,321 (EP-A 179,506), to firstly subject a foil made of such a material, intended for the manufacture of a shadow mask, to a heat treatment in order to reduce its 0.2% yield stress at room temperature and to then perform shaping above room temperature so as to further reduce its 0.2% yield stress. The iron/nickel alloy used in this process has a coefficient of linear expansion of between $1\times10^{-6}$ $K^{-1}$ and $1.5\times10^{-6}$ $K^{-1}$. A lower coefficient of expansion can be obtained by replacing part of the nickel with cobalt in amounts of between 2% and 12% by weight. However, the substitution of nickel by cobalt has many drawbacks. On the one hand, cobalt is a very expensive element and, on the other hand, cobalt contaminates the chemical etching reagents used for drilling the holes in the shadow mask by chemical etching.

SUMMARY OF THE INVENTION

One object of the present invention is to provide a process for manufacturing a shadow mask made of an iron/nickel alloy which preferably contains no or very little cobalt, has a coefficient of linear expansion of less than $0.9\times10^{-6}$ $K^{-1}$ and is easy to roll.

Another object of the present invention is to provide a shadow mask comprising an iron/nickel alloy.

DETAILED DESCRIPTION OF THE INVENTION

The present invention process for manufacturing a shadow mask comprises the following steps:

a foil perforated with holes, preferably uniformly distributed holes or holes in a shadow mask effective pattern, is provided, this foil comprising an iron/nickel alloy whose chemical composition comprises, by weight:

| | |
|---|---|
| 35.5% ≦ | Ni ≦ 37% |
| | Co ≦ 0.5% |
| | Cr ≦ 0.1% |
| | Cu ≦ 0.1% |
| | Mo ≦ 0.1% |
| | V ≦ 0.1% |
| | Nb ≦ 0.1% |
| | Mn ≦ 0.1% |
| 0.03% ≦ | Si ≦ 0.15% |
| | S ≦ 0.001% |
| 0.0001% ≦ | Ca ≦ 0.002% |
| 0.0001% ≦ | Mg ≦ 0.002% |
| | Al ≦ 0.005% |
| | O ≦ 0.01% |
| | C ≦ 0.02% |
| | N ≦ 0.005% |
| | P ≦ 0.003% |
| | H ≦ 0.001% |
| | B ≦ 0.001% |

the balance being iron and inevitable impurities resulting from preparation such as smelting; the chemical composition further preferably satisfying the relationships:

$$S\leqq0.02\times Mn+0.8\times Ca+0.6\times Mg$$

and $$Cr+Cu+Mo+V+Nb+Si\leqq0.15\%$$

the foil is subjected to a heat treatment in order to obtain grains whose size, as defined by the ASTM E112-88, 12.4 standard, incorporated herein by reference, is greater than or equal to ASTM 7;

optionally, the foil is formed in order to give it the desired shape of a shadow mask.

Preferably, the foil of the invention has the following dimensions: length 500 mm–700 mm; width 300 mm–500 mm; thickness 0.1 mm–0.25 mm but is not limited thereto and can be of any size convenient for preparing a shadow mask.

Preferably, the chemical composition should be chosen so that:

Si≦0.08%

Cr≦0.07%

Cu≦0.05%

Mo≦0.05%

Mn≦0.05%

O≦0.005%

N≦0.003%

S≦0.0005%

C≦0.005%

B≦0.0004%

In order for the coefficient of expansion to be as low as possible, it is preferable that the nickel content be between 35.9% and 36.2%.

Heat treatment is preferably carried out by holding at a temperature of between 750° C. and 850° C. in a non-oxidizing atmosphere.

The present invention shadow mask comprises, and preferably consists of, an iron/nickel alloy having a coefficient of linear expansion, between 20° C. and 100° C., of less than $0.9\times10^{-6}$ $K^{-1}$ and preferably less than $0.8\times10^{-6}$ $K^{-1}$, in which the chemical composition of the iron/nickel alloy comprises, by weight:

| |
|---|
| 35.5% ≦ Ni ≦ 37% |
| Co ≦ 0.5% |
| Cr ≦ 0.1% |
| Cu ≦ 0.1% |
| Mo ≦ 0.1% |
| V ≦ 0.1% |
| Nb ≦ 0.1% |
| Mn ≦ 0.1% |
| 0.03% ≦ Si ≦ 0.15% |
| S ≦ 0.001% |
| 0.0001% ≦ Ca ≦ 0.002% |
| 0.0001% ≦ Mg ≦ 0.002% |
| Al ≦ 0.005% |
| O ≦ 0.01% |
| C ≦ 0.02% |
| N ≦ 0.005% |
| P ≦ 0.003% |
| H ≦ 0.001% |
| B ≦ 0.001% |

the balance being iron and inevitable impurities resulting from production such as smelting; the chemical composition preferably satisfying the relationships:

$$S \leqq 0.02 \times Mn + 0.8 \times Ca + 0.6 \times Mg$$

and $$Cr + Cu + Mo + V + Nb + Si \leqq 0.15\%$$

Preferably, the chemical composition of the iron/nickel alloy constituting the shadow mask is such that by weight:

Si≦0.08%

Cr≦0.07%

Cu≦0.05%

Mo≦0.05%

Mn≦0.05%

O≦0.005%

N≦0.003%

S≦0.0005%

C≦0.005%

B≦0.0004%

It is also preferable for the nickel content to be between 35.9% and 36.2%.

Finally, it is desirable for the grains of the iron/nickel alloy to have a size, measured according to the ASTM E112-88,12.4 standard, greater than the ASTM 7 index.

DESCRIPTION OF THE PREFERRED EMBODIMENTS

The invention will now be described in more detail, but in a non-limiting way.

In a preferred embodiment of the invention method and invention shadow mask a sheet having a thickness of approximately 150 μm is obtained by hot-rolling and then cold-rolling of an ingot or a slab of iron/nickel alloy containing, by weight:

| |
|---|
| 35.5% ≦ Ni ≦ 37% |
| Co ≦ 0.5% |
| Cr ≦ 0.1% |
| Cu ≦ 0.1% |
| Mo ≦ 0.1% |
| V ≦ 0.1% |
| Nb ≦ 0.1% |
| Mn ≦ 0.1% |
| 0.03% ≦ Si ≦ 0.15% |
| S ≦ 0.001% |
| 0.0001% ≦ Ca ≦ 0.002% |
| 0.0001% ≦ Mg ≦ 0.002% |
| Al ≦ 0.005% |
| O ≦ 0.01% |
| C ≦ 0.02% |
| N ≦ 0.005% |
| P ≦ 0.003% |
| H ≦ 0.001% |
| B ≦ 0.001% |

the balance being iron and inevitable impurities resulting from smelting; the chemical composition satisfying the relationships:

$$S \leqq 0.02 \times Mn + 0.8 \times Ca + 0.6 \times Mg$$

and $$Cr + Cu + Mo + V + Nb + Si \leqq 0.15\%$$

The composition of this alloy is chosen so as to obtain a coefficient of linear expansion less than $0.9\times10^{-6}$ $K^{-1}$ and preferably less than $0.8\times10^{-6}$ $K^{-1}$, and to provide suitability for hot-rolling and cold-rolling, suitability for obtaining, by chemical etching, very fine and very closely spaced holes distributed over the sheet, and suitability for cold-forming by drawing.

While not being bound by a particular theory, nickel and iron are throught to be the most important main components, and the nickel, chromium, copper, molybdenum, vanadium, niobium, silicon and manganese contents, as well as the relationship:

$$Cr + Cu + Mo + V + Nb + Si \leqq 0.15\%$$

are imposed in order that the coefficient of linear expansion is less than $0.9\times10^{-6}$ $K^{-1}$. It is preferable that the nickel content is between 35.9% and 36.2% by weight, and that the chromium content, by weight, is less than 0.07%, the copper, molybdenum, manganese contents are preferably less than 0.05% and the silicon content is preferably less than 0.08%; a coefficient of linear expansion less than $0.8\times10^{-6}$ $K^{-1}$ is thus obtained.

The cobalt content should remain less than 0.5% by weight in order to prevent contamination of the etchant used for the chemical etching operation.

The limits of the sulphur, silicon, calcium, magnesium, silicon, oxygen and phosphorus contents as well as the relationship $$S \leqq 0.02 \times Mn + 0.8 \times Ca + 0.6 \times Mg$$

are imposed so as to obtain good rollability, despite the very low manganese content. Preferably, the oxygen content should be less than 0.005% by weight and the sulphur content less than 0.0005% by weight.

The aluminium content should be less than 0.005% by weight and the nitrogen content less than 0.005% by weight and preferably less than 0.003%, so as to prevent the formation of aluminium nitrides, this being unfavorable to the hot deformabilty.

The carbon content should remain less than 0.02% by weight and preferably less than 0.005%, so as to reduce the yield stress, this being favorable to the drawability.

The hydrogen content should be limited to 0.001% in order to prevent the formation of blowholes.

The boron content should remain less than 0.001% by weight and preferably less than 0.0004% in order to prevent the formation of pulverulent nitrides at the surface of the sheet during the heat treatment.

Very fine holes are typically created in the sheet by a chemical photoetching process. These holes may have any desirable shape, for example round or elongate. After etching the holes, the sheet, on which separating lines have also been etched, is cut up into foils, each of these foils forming a shadow mask foil which includes an array of holes.

The material constituting the shadow mask foil thus obtained has a 0.2% yield stress of between 580 MPa and 640 MPa at room temperature, this being too high to obtain a shadow mask foil having the desired curvature. In order to reduce this yield stress, the shadow mask foil is preferably annealed for approximately 15 minutes in a hydro-containing atmosphere (approximately 10% $H_2$, the balance $N_2$) at a temperature of between 750° C. and 850° C., and a material is thus obtained which has a grain size of approximately 15μm, a coercivity of approximately 40 A/m and a coefficient of linear expansion, between 20° C. and 100° C., which is less than or equal to $0.9\times10^{-6}$ $K^{-1}$.

The yield stress of 280 MPa, although reduced, remains too high, however, for the process for shaping the shadow mask to be reproducible. It is, consequently, necessary to reduce the yield stress further. In order to do this, the shadow mask foil is shaped at a temperature of between 50° C. and 250° C. At 200° C., the yield stress is approximately 130 MPa. 0.2% yield stresses of 110 MPa to 140 MPa at 150° C.–250° C. are preferred.

EXAMPLE

By way of example, a shadow mask is manufactured with a material, according to the invention, whose chemical composition by weight comprises:

Ni=36.13%
Co=0.015%
Cr=0.02%
Cu<0.01%
Mo=0.0055%
V<0.005%
Nb<0.005%
Si=0.078%
Mn=0.024%
S<0.0005%
Ca=0.0003%
Mg=0.0004%
Al<0.005%
O=0.0042%
C=0.003%
N=0.0033%
P<0.003%
H<0.001%
B<0.0004%

The contents indicated as being "less than" are contents below the sensitivity threshold of the analytical procedures used.

The shadow mask thus obtained had a local doming defect less by at least 15% than the same kind of defect observed on a comparable shadow mask made of an iron/nickel alloy according to the prior art.

Because of the low cobalt content, the chemical etching process is not affected by this element. The coercive field, being less than 55 A/m, is particularly favorable to the process for demagnetizing the shadow masks employed once the tube is switched on.

One of the advantages of the invention is that the shadow mask does not need to be coated with a layer, such as a layer of $Bi_2O_3$, $Al_2O_3$ or lead borate glass, in order to inhibit heat-up due to the electron bombardment.

The invention shadow masks may have circular holes elongate holes, etc., and is particularly suitable for the manufacture of shadow masks for color display cathode-ray tubes, the masks may have a very large number of holes with very small spaces between holes.

It may be noted that the foil for shadow masks according to the invention, containing very small amounts of Si, Mn and Cr in particular, has a more homogeneous crystalline structure, which improves chemical etchability. This is very important for the shadow masks intended for color tubes, for which the masks have a very large number of very closely spaced holes.

This application is based on French Patent Application 94 15663 filed Dec. 27, 1994, incorporated herein by reference.

What is claimed as new and is desired to be secured by Letters Patent of the United States is:

1. A process for manufacturing a shadow mask made of an iron/nickel alloy, wherein:

a foil perforated with holes is provided, this foil comprising an iron/nickel alloy whose chemical composition comprises, by weight:

| | |
|---|---|
| 35.5% | Ni ≦ 37% |
| | Co ≦ 0.5% |
| | Cr ≦ 0.1% |
| | Cu ≦ 0.1% |
| | Mo ≦ 0.1% |
| | V ≦ 0.1% |
| | Nb ≦ 0.1% |
| | Mn ≦ 0.1% |
| 0.03% ≦ | Si ≦ 0.15% |
| | S ≦ 0.001% |
| 0.0001% ≦ | Ca ≦ 0.002% |
| 0.0001% ≦ | Mg ≦ 0.002% |
| | Al ≦ 0.005% |
| | O ≦ 0.01% |
| | C ≦ 0.02% |
| | N ≦ 0.005% |
| | P ≦ 0.003% |
| | H ≦ 0.001% |
| | B ≦ 0.001% |

the balance being iron and inevitable impurities resulting from production, the chemical composition satisfying the relationships:

$$S \leqq 0.02 \times Mn + 0.08 \times Ca + 0.6 \times Mg$$

and $$Cr + Cu + Mo + V + Nb + Si \leqq 0.15\%$$

the foil is subjected to heat treatment in order to obtain grains whose size, as defined by the ASTM E112-88, 12.4 standard, is greater than or equal to ASTM 7;

the foil is formed in order to give it the shape of a shadow mask.

2. The process according to claim 1, wherein the chemical composition of the iron/nickel alloy comprises by weight:

Si≦0.08%

Cr≦0.07%

Cu≦0.05%

Mo≦0.05%

Mn≦0.05%

O≦0.005%

N≦0.003%

S≦0.005%

C≦0.005%

B≦0.004%.

3. The process according to claim 1, wherein the chemical composition of the iron/nickel alloy comprises, by weight:

$$35.9 \leqq Ni \leqq 36.2\%.$$

4. The process according to claim 1, wherein the heat treatment is carried out by holding the foil at a temperature of between 750° C. and 850° C. in a non-oxidizing atmosphere.

5. A shadow mask comprising an iron/nickel alloy having a coefficient of linear expansion, between 20° C. and 100° C., of less than $0.9 \times 10^{-6}\ K^{-1}$ wherein the chemical composition of the iron/nickel alloy comprises, by weight:

| |
|---|
| 35.5% ≦ Ni ≦ 37% |
| Co ≦ 0.5% |
| Cr ≦ 0.1% |
| Cu ≦ 0.1% |
| Mo ≦ 0.1% |
| V ≦ 0.1% |
| Nb ≦ 0.1% |
| Mn ≦ 0.1% |
| 0.03% ≦ Si ≦ 0.15% |
| S ≦ 0.001% |
| 0.0001% ≦ Ca ≦ 0.002% |
| 0.0001% ≦ Mg ≦ 0.002% |
| Al ≦ 0.005% |
| O ≦ 0.01% |
| C ≦ 0.02% |
| N ≦ 0.005% |
| P ≦ 0.003% |
| H ≦ 0.001% |
| B ≦ 0.001% |

the balance being iron and inevitable impurities resulting from production; the chemical composition satisfying the relationships:

$$S \leqq 0.02 \times Mn + 0.8 \times Ca + 0.6 \times Mg.$$

and $$Cr + Cu + Mo + V + Nb + Si \leqq 0.15\%.$$

6. The shadow mask according to claim 5, wherein:

Si≦0.08%

Cr≦0.07%

Cu≦0.05%

Mo≦0.05%

Mn≦0.05%

S≦0.005%

N≦0.003%

S≦0.0005%

C≦0.005%

B≦0.0004%.

7. The shadow mask according to claim 5, wherein the chemical composition of the iron/nickel alloy comprises, by weight:

$$35.9\% \leqq Ni \leqq 36.2\%.$$

8. The shadow mask according to claim 5, wherein the grains of the iron/nickel alloy have a size, measured according to the ASTM E112-88,12.4 standard, greater than the ASTM 7 index.

* * * * *